(12) United States Patent
Morich et al.

(10) Patent No.: US 9,494,667 B2
(45) Date of Patent: Nov. 15, 2016

(54) HYBRID MR/PET WITH CORRECTION FOR RADIATION ABSORPTION BY MR COIL

(75) Inventors: Michael A. Morich, Mentor, OH (US); Gordon D. Demeester, Wickliffe, OH (US); Daniel Gagnon, Twinsburg, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 2007 days.

(21) Appl. No.: 12/598,484

(22) PCT Filed: Apr. 17, 2008

(86) PCT No.: PCT/IB2008/051475
§ 371 (c)(1),
(2), (4) Date: Nov. 2, 2009

(87) PCT Pub. No.: WO2008/135873
PCT Pub. Date: Nov. 13, 2008

(65) Prior Publication Data
US 2010/0135559 A1 Jun. 3, 2010

Related U.S. Application Data

(60) Provisional application No. 60/916,012, filed on May 4, 2007.

(51) Int. Cl.
*G01R 33/381* (2006.01)
*G01R 33/48* (2006.01)
(Continued)

(52) U.S. Cl.
CPC .......... *G01R 33/481* (2013.01); *G01R 33/4808* (2013.01); *G01T 1/1603* (2013.01); *G01T 1/1647* (2013.01)

(58) Field of Classification Search
USPC ............ 250/363.02–363.04, 363.09; 378/65; 600/410, 411; 382/128, 131
See application file for complete search history.

(56) References Cited

U.S. PATENT DOCUMENTS

| 4,939,464 A | 7/1990 | Hammer |
| 7,218,112 B2 * | 5/2007 | Ladebeck et al. ............ 324/318 |

(Continued)

FOREIGN PATENT DOCUMENTS

| DE | 102006046287 A1 | 9/2006 |
| EP | 1413251 A1 | 4/2004 |

(Continued)

OTHER PUBLICATIONS

Robson et al., "Magnetic Resonance: An Introduction to Ultrashort TE (UTE) Imaging," Comput Assist Tomogr, vol. 27, No. 6, Nov./Dec. 2003.*

(Continued)

*Primary Examiner* — Eliza Lam

(57) ABSTRACT

An imaging method comprises: acquiring magnetic resonance data of a subject using a magnetic resonance component (30, 30') disposed with the subject; acquiring nuclear imaging data of the subject with the magnetic resonance component disposed with the subject; determining a position of the magnetic resonance component respective to a frame of reference of the nuclear imaging data; and reconstructing the nuclear imaging data (60) to generate a nuclear image (62) of at least a portion of the subject. The reconstructing includes adjusting at least one of the nuclear imaging data and the nuclear image based on a density map (46) of the magnetic resonance component and the determined position of the magnetic resonance component respective to the frame of reference of the nuclear imaging data to correct the nuclear image for radiation absorption by the magnetic resonance component.

24 Claims, 6 Drawing Sheets

Figure 1:
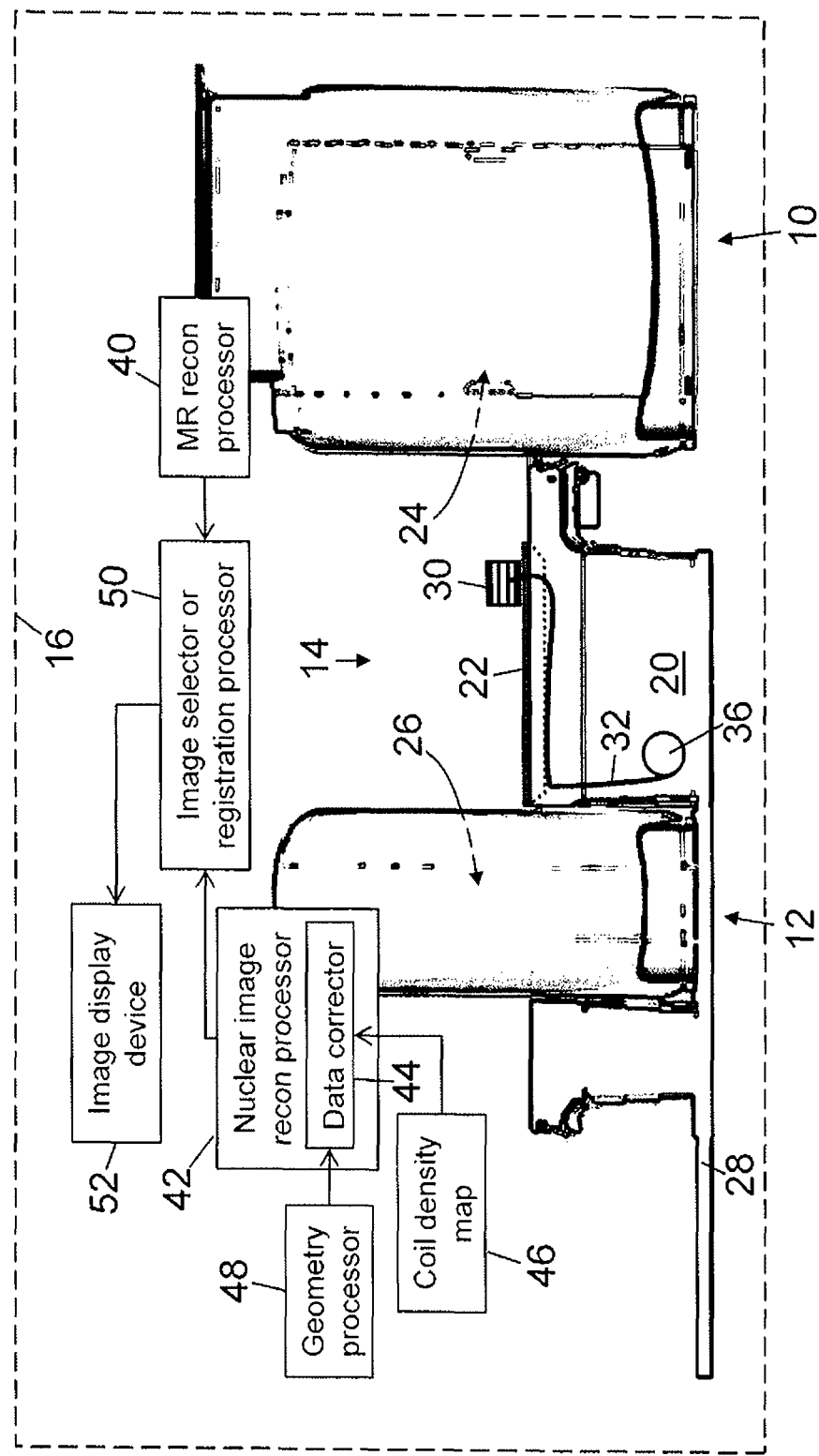

(51) Int. Cl.
  *G01T 1/16* (2006.01)
  *G01T 1/164* (2006.01)

(56) References Cited

U.S. PATENT DOCUMENTS

| | | | |
|---|---|---|---|
| 7,221,733 B1* | 5/2007 | Takai et al. | 378/65 |
| 7,522,952 B2* | 4/2009 | Krieg et al. | 600/411 |
| 2003/0220559 A1* | 11/2003 | Ehnholm et al. | 600/410 |
| 2004/0120557 A1* | 6/2004 | Sabol et al. | 382/128 |
| 2004/0122706 A1* | 6/2004 | Walker et al. | 705/2 |
| 2004/0195512 A1* | 10/2004 | Crosetto | 250/363.04 |
| 2005/0152492 A1 | 7/2005 | Yakubovsky et al. | |
| 2006/0052685 A1 | 3/2006 | Cho et al. | |
| 2006/0237652 A1* | 10/2006 | Kimchy et al. | 250/363.02 |
| 2006/0251312 A1 | 11/2006 | Krieg et al. | |
| 2006/0273795 A1 | 12/2006 | Rieke et al. | |
| 2008/0030195 A1 | 2/2008 | Hagen et al. | |
| 2008/0088309 A1* | 4/2008 | Eberler et al. | 324/318 |
| 2008/0135769 A1* | 6/2008 | Rosen | 250/363.09 |
| 2008/0156993 A1* | 7/2008 | Weinberg et al. | 250/363.03 |
| 2010/0074501 A1* | 3/2010 | Ladebeck et al. | 382/131 |

FOREIGN PATENT DOCUMENTS

| | | |
|---|---|---|
| JP | 2003294842 A | 10/2003 |
| JP | 2006071922 A | 3/2006 |
| WO | 03003038 A1 | 1/2003 |
| WO | 03025621 A1 | 3/2003 |
| WO | 2006111869 A2 | 10/2006 |
| WO | 2006111883 A2 | 10/2006 |
| WO | 2006119085 A2 | 11/2006 |

OTHER PUBLICATIONS

Handler, W. B., et al.; Simulation of scattering and attenuation of 511 keV photons in a combined PET/field-cycled MRI system; 2006; Phys. Med. Biol.; 51:2479-2491.

Marsden, P. K., et al.; Simultaneous PET and NMR; 2002; The British Journal of Radiology; 75:S53-S59.

Zaidi, H., et al.; Magnetic resonance imaging-guided attenuation and scatter corrections in three-dimensional brain positron emission tomography; 2003; Am. Assoc. Phys. Med.; 30(5)937-948.

Jamali, P., et al.; Magnetic Field Inhomogeneities Induced by PET Detector Scintillators in Dual Modality MRI/PET Systems; 2006; Proc. Intl. Soc. Mag. Reson. Med.; 14:1360.

* cited by examiner

HYBRID MR/PET WITH CORRECTION FOR RADIATION ABSORPTION BY MR COIL

CROSS REFERENCE TO RELATED APPLICATIONS

This application claims the benefit of U.S. provisional application Ser. No. 60/916,012 filed May 4, 2007, which is incorporated herein by reference.

The present application relates to the imaging arts. It particularly relates to combined magnetic resonance (MR) and positron emission tomography (PET) imaging systems, and is described with particular reference thereto. The following relates more generally to imaging systems that combine the MR imaging modality with a nuclear imaging modality such as the aforementioned PET modality, or single photon emission computed tomography (SPECT), or so forth.

In a hybrid imaging system, two or more medical imaging modalities are integrated into the same facility or room, or even into the same scanner housing, so as to combine the advantages of the constituent modalities to acquire more useful information about the imaged subject. Hybrid imaging systems also make it easier to spatially and temporally register images from the constituent modalities as compared with acquiring such images by discrete, separate imaging systems. Separate imaging systems have a longer lag time between studies, and make it difficult to minimally disturb the patient between studies. Commercially available hybrid imaging systems include the Precedence™ SPECT/computed tomography (CT) system and the Gemini™ PET/CT system, both of which are available from Philips Medical Systems, Eindhoven, The Netherlands.

There is also interest in hybrid MR/PET imaging systems. In some approaches, such as those disclosed in Cho et al., U.S. Publ. Appl. 2006/0052685 A1, the physically separate MR and PET scanners are provided, and patient support is arranged to move the patient into either the MR scanner or the PET scanner. In other approaches the PET detectors are integrated with the MR scanner. See, for example, Fiedler et al., WO 2006/111869 and Frach et al., WO 2006/111883 for some examples of such integrated approaches. A variation on the integrated approach, disclosed in Hammer, U.S. Pat. No. 4,939,464, is to integrate only the scintillators of the PET scanner into the magnetic resonance scanner.

An advantage of a hybrid MR/PET or hybrid MR/SPECT imaging system is that the subject is not moved between the MR or PET imaging, or is moved only a relatively short distance without being repositioned while remaining disposed on a common subject carrier (as shown, for example, in Cho et al., U.S. Publ. Appl. 2006/0052685 A1). This advantage is also attained in other hybrid systems such as SPECT/CT or PET/CT.

When one of the modalities is MR, this advantage is partially negated if the MR imaging employs one or more local radio frequency coils. When the subject is imaged using MR a local radio frequency coil or coils can be used as a receive coil or coil array to acquire magnetic resonance data, and optionally can be used in transmit mode to excite magnetic resonance. Local coils have the advantage of close positioning respective to the subject which improves signal-to-noise ratio and other imaging metrics. The nuclear imaging modality, on the other hand, does not use the local coils. One can remove the local coils when switching from MR imaging to nuclear imaging or, equivalently, one can mount the local coils when switching from nuclear imaging to MR imaging. However, removing or mounting the local coils between MR and nuclear imaging has disadvantages such as lengthening the time of the imaging session and enhancing the likelihood that the subject may move in a manner that makes spatial registration of the nuclear images and SPECT images difficult or less accurate. Moreover, for integrated MR/PET scanners this entails the otherwise unnecessary operations of retracting the subject from the examination region to remove or mount the local coils, and then reinserting the subject. Still further, an advantage of the integrated scanner in which the PET and MR components are in the same housing is the possibility of acquiring PET and MR data concurrently, in which case the local coil is preferably mounted during the concurrent PET and MR imaging.

As an alternative option, the local coil or coils can be left mounted during the nuclear imaging. However, this approach has the disadvantage that the coil or coils may absorb radiation used in the nuclear imaging so as to create shadows, shading, density gradients, or other extraneous artifacts in the nuclear images. These artifacts can hide or obscure subject features of interest in the nuclear image, or can be misinterpreted as subject features, leading to misdiagnosis or other interpretive error.

In accordance with one aspect an imaging method is disclosed, comprising: acquiring magnetic resonance data of a subject using a magnetic resonance component disposed with the subject; acquiring nuclear imaging data of the subject with the magnetic resonance component disposed with the subject; determining a position of the magnetic resonance component respective to a frame of reference of the nuclear imaging data; and reconstructing the nuclear imaging data to generate a nuclear image of at least a portion of the subject. The reconstructing includes adjusting at least one of the nuclear imaging data and the nuclear image based on a density map of the magnetic resonance component and the determined position of the magnetic resonance component respective to the frame of reference of the nuclear imaging data to correct the nuclear image for radiation absorption by the magnetic resonance component.

In accordance with another aspect, an imaging system is disclosed, comprising: a magnetic resonance imager configured to acquire magnetic resonance data of a subject; a nuclear imager configured to acquire nuclear imaging data from the subject; a subject support configured to support the subject for acquisition of magnetic resonance data by the magnetic resonance imager and for acquisition of nuclear imaging data by the nuclear imager without repositioning the subject on the subject support; a magnetic resonance component disposed with the subject on the subject support at a determinable position respective to a frame of reference of the nuclear imager, the magnetic resonance component cooperating with the magnetic resonance imager in the acquisition of magnetic resonance data; and a nuclear image reconstruction processor configured to reconstruct the nuclear imaging data to generate a nuclear image of at least a portion of the subject, the nuclear image reconstruction processor including a data corrector that adjusts at least one of the nuclear imaging data and the nuclear image based on a density map of the magnetic resonance component to correct the nuclear image for radiation absorption by the magnetic resonance component.

In accordance with another aspect, one or more digital storage media are disclosed, the one or more digital storage media storing information for use in correcting at least one of nuclear imaging data acquired from a subject and a nuclear image of at least part of the subject derived from said nuclear imaging data for radiation absorption by a magnetic resonance component disposed with the subject during acquisition of the nuclear imaging data. The stored information includes at least a density map of the magnetic resonance component.

In accordance with another aspect, a local magnetic resonance component is disclosed for use in a hybrid imaging system that provides both magnetic resonance imaging capability and at least one nuclear imaging capability, the magnetic resonance component comprising: a body configured to be disposed with a subject during both magnetic resonance imaging and nuclear imaging, at least a portion of the body being absorptive for radiation used in the nuclear imaging such that the body affects the nuclear imaging; and at least one position identification element disposed with the body, the at least one position identification element enabling determination of the position of the body respective to a frame of reference of the nuclear imaging data.

One advantage resides in enabling a local coil used in MR imaging to be left in place during nuclear imaging performed before, after, or concurrently with the MR imaging with suppressed concomitant artifacts in the nuclear images.

Another advantage resides in more rapid hybrid MR/nuclear imaging workflow by facilitating retention in place of local radio frequency coils used in MR imaging during nuclear imaging.

Another advantage resides in facilitating concurrent MR and nuclear data acquisition.

Another advantage resides in improved nuclear images acquired using a hybrid MR/nuclear imaging system.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

FIG. 1 diagrammatically depicts an imaging system including a magnetic resonance imager and a nuclear imager.

Figure 2:
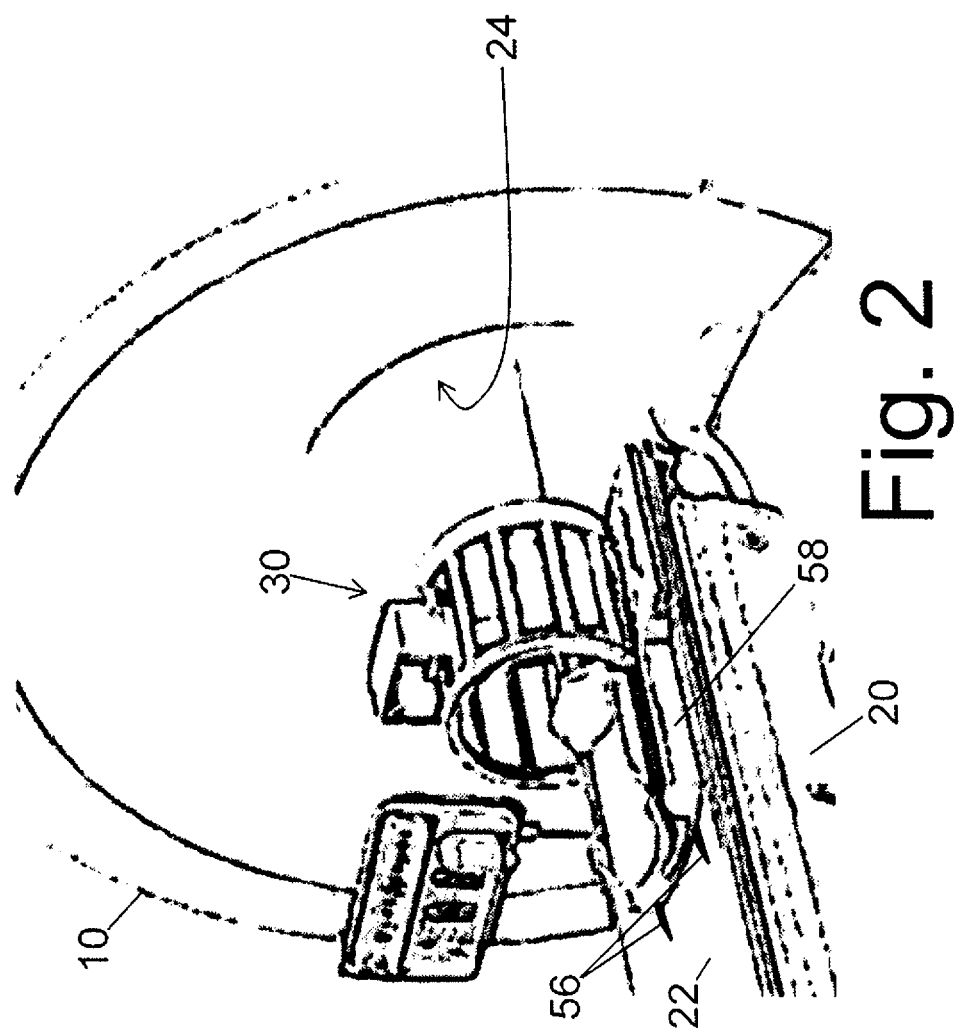

FIG. 2 diagrammatically depicts a perspective view of the head coil and the subject support of the imaging system of FIG. 1.

Figure 3:
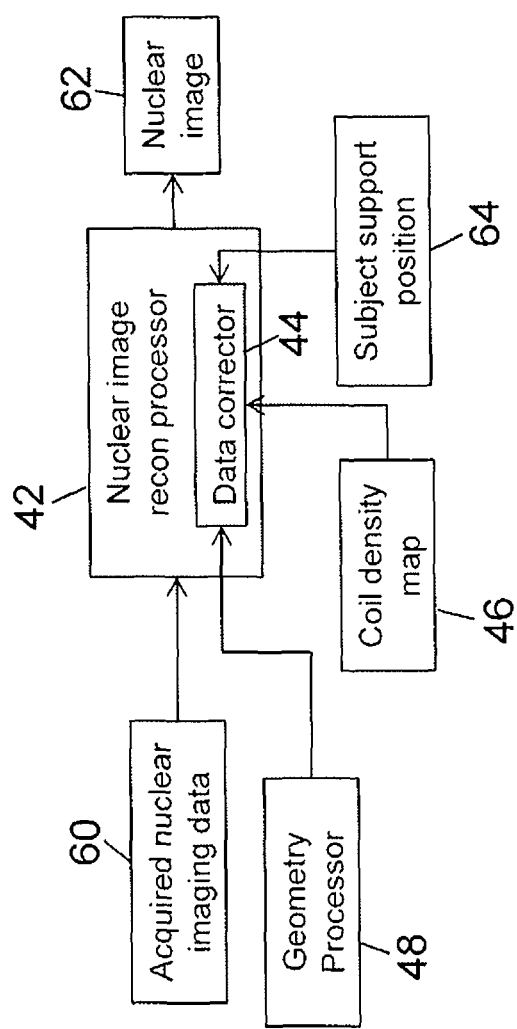

FIG. 3 diagrammatically depicts a first embodiment of nuclear imaging data reconstruction components suitable for use in the imaging system of FIG. 1 to reconstruct nuclear imaging data with correction for radiation absorption by the head coil disposed with the imaged subject.

Figure 4:
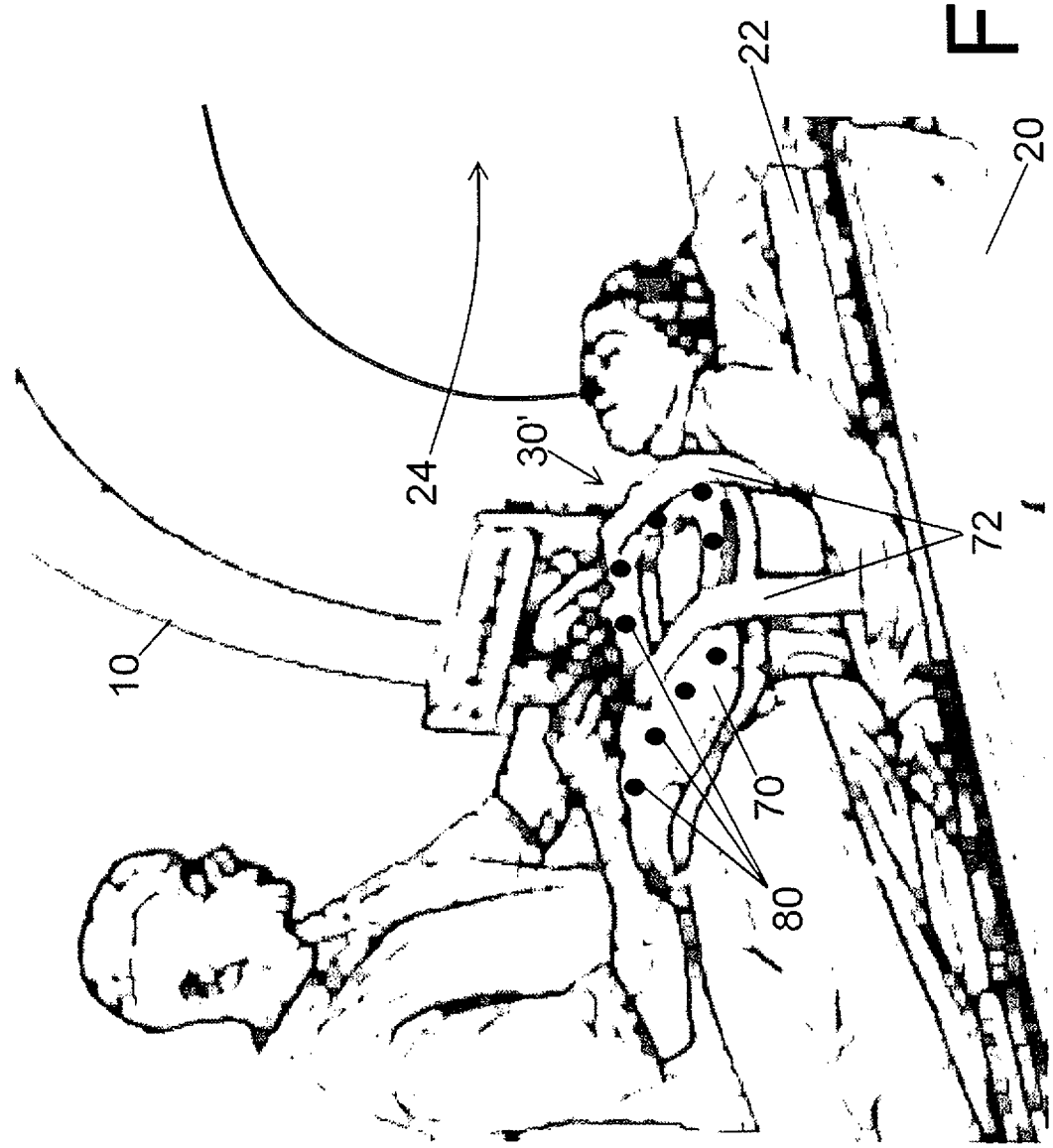

FIG. 4 diagrammatically depicts an alternative embodiment of the imaging system of FIG. 1 in which the head coil is replaced by a SENSE or other body coil disposed on top of and below the torso of a subject and including a plurality of fiducial markers.

Figure 5:
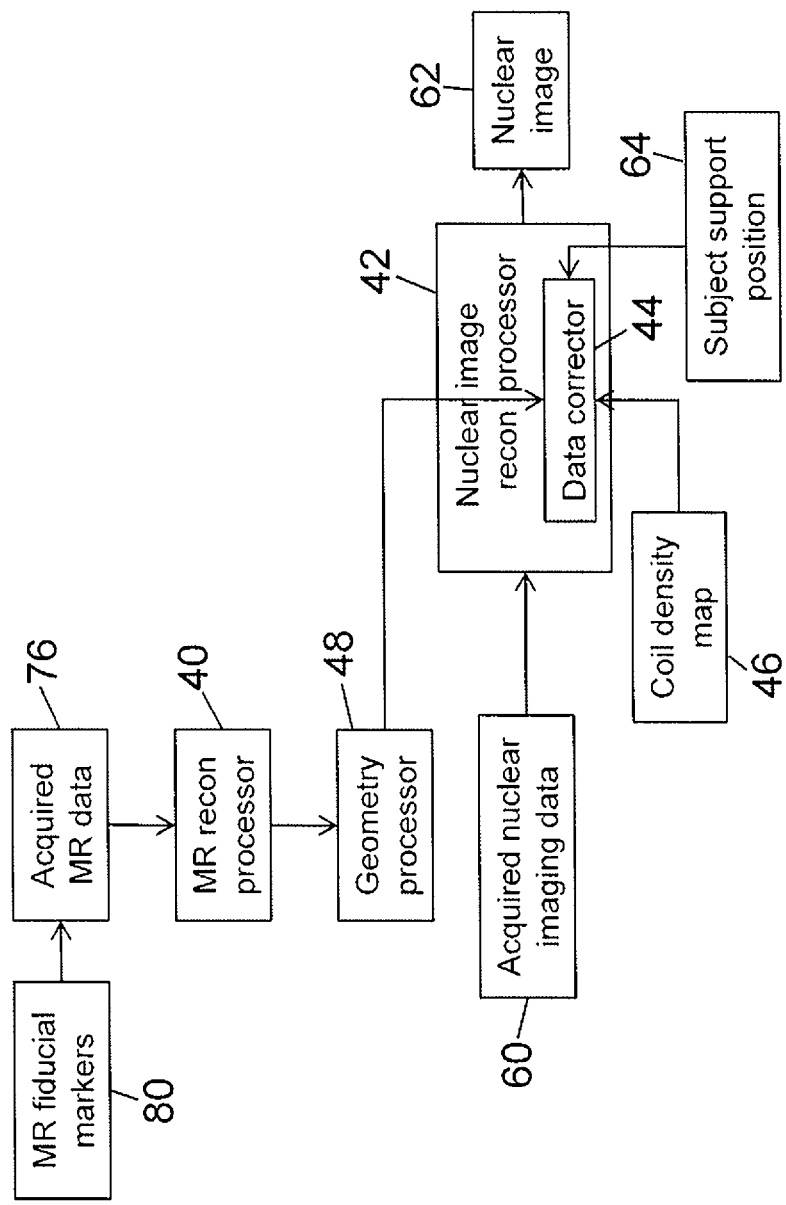

FIG. 5 diagrammatically depicts a second embodiment of nuclear imaging data reconstruction components suitable for use in the imaging system of FIG. 1 to reconstruct nuclear imaging data with correction for radiation absorption by the head coil disposed with the imaged subject.

Figure 6:
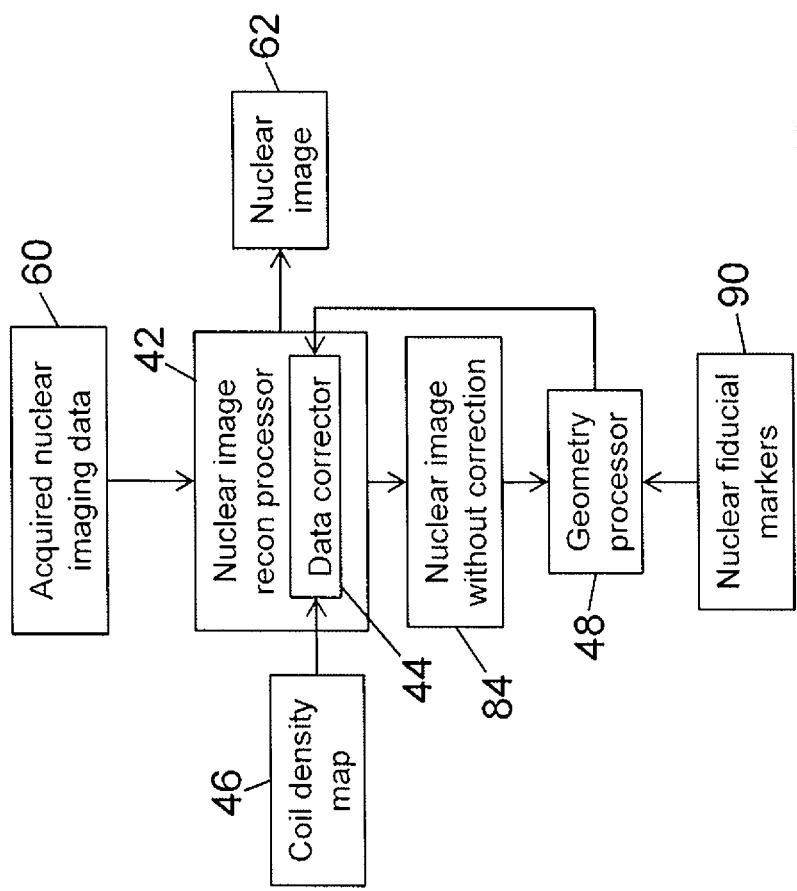

FIG. 6 diagrammatically depicts a third embodiment of nuclear imaging data reconstruction components suitable for use in the imaging system of FIG. 1 to reconstruct nuclear imaging data with correction for radiation absorption by the head coil disposed with the imaged subject.

With reference to FIG. 1, a hybrid imaging system includes a magnetic resonance (MR) imager 10, a nuclear imager 12, and a subject support, such as an illustrated patient bed 14, disposed between the MR imager 10 and the nuclear imager 12. A radio frequency shield substantially surrounds and defines a radio frequency isolated room or space 16. The MR imager 10, the nuclear imager 12, and patient bed 14 are disposed within the radio frequency isolated room. In an alternative arrangement, such as that shown in Cho et al., U.S. Publ. Appl. 2006/0052685 which is incorporated herein by reference, the MR imager and nuclear imager are disposed in separate rooms or partitions, and optionally only the room or partition containing the MR imager is radio frequency shielded. Other alternative arrangements, such as those shown in Fiedler et al. WO 2006/111869 or Frach et al. WO 2006/111883 or Hammer U.S. Pat. No. 4,939,464, all three of which are incorporated herein by reference, portions of the nuclear imager including the radiation detectors (or at least scintillators of the radiation detectors) are integrated into the MR imager. The MR imager 10 in some embodiments is a commercial MR scanner such as an Achieva™ or Intera™ magnetic resonance scanner available from Philips Medical Systems, Eindhoven, The Netherlands. More generally, the MR imager 10 can be of substantially any type, such as the depicted horizontal cylindrical bore magnet scanner, an open MR scanner, or so forth.

The nuclear imager 12 is in some embodiments a positron emission tomography (PET) imager or a single photon emission computed tomography (SPECT) imager. Typically, the nuclear imager 12 is configured to detect at least one of high energy particles and high energy photons. For example, a PET imager detects 511 keV photons generated by positron-electron annihilation events, while a gamma camera employed in SPECT imaging is configured to detect selected gamma rays (photons), or so forth emitted by a selected radiopharmaceutical. In some embodiments the nuclear imager 12 is a commercial PET scanner such as an Allegro™ or Mosaic™ PET scanner available from Philips Medical Systems, Eindhoven, The Netherlands. In some embodiments the nuclear imager 12 is a commercial gamma camera such as a Forte™, Skylight™, or Brightview™ gamma camera available from Philips Medical Systems, Eindhoven, The Netherlands. It is also contemplated for the nuclear imager 12 to itself comprise two or more constituent imaging systems. For example, the nuclear imager 12 may be a Precedence™ SPECT/CT system or a Gemini™ PET/CT system, both also available from Philips Medical Systems, Eindhoven, The Netherlands. A nuclear imager in the form of a combined PET/SPECT imager or a gamma camera configured to acquire both SPECT and PET imaging data are other contemplated arrangements.

The illustrated arrangement of the patient bed 14 between the MR imager 10 and the nuclear imager 12 is advantageous because it physically separates the MR and nuclear imagers 10, 12. This physical separation reduces the adverse effect of the static magnetic field generated by the MR imager 10 on the nuclear imager 12, and also reduces the adverse effect of the ferromagnetic mass and radio frequency interference sourcing of the nuclear imager 12 on the MR imager 10. The illustrated patient bed 14 includes a base 20 and a linearly translatable subject support 22 in the form of a patient pallet coupled with the base 20 and aligned to be selectively moved into an examination region 24 of the MR imager 10 for MR imaging and into an examination region 26 of the nuclear imager 12 for nuclear imaging (e.g., PET or SPECT imaging). The illustrated base 20 is optionally configured to be lowered during patient loading to enable easier loading of the patient onto the patient support pallet 22. The nuclear imager 12 is optionally mounted on rails 28 to enable the nuclear imager 12 to be translated away from the MR imager 10 to facilitate patient loading, maintenance operations, or so forth. In such embodiments, the nuclear imager 12 is optionally moved away from the MR imager 10 during MR imaging to reduce the effect of the ferromagnetic mass of the nuclear imager 12 on the MR imaging. Advantageously, the subject support 14 can move the subject between the MR imager 10 for MR imaging and the nuclear imager 12 for nuclear imaging without the patient being repositioned on the subject support.

In other contemplated embodiments, the nuclear imager, or at least radiation detectors or scintillators of the nuclear imager, are integrally housed in the MR imager housing. Some suitable integrated arrangements are disclosed, for example, in Fiedler et al. WO 2006/111869, Frach et al. WO 2006/111883, and Hammer U.S. Pat. No. 4,939,464. In such integrated embodiments, the examination regions for the MR imaging and the nuclear imaging may be one and the same, or may be offset but spatially overlapping. Advantageously, in these embodiments the MR data and nuclear imaging data may be acquired simultaneously or in succession (either MR data first followed by nuclear imaging data, or vice versa), or in interleaved fashion, without moving the subject.

With continuing reference to FIG. 1, the illustrated imaging system includes a local radio frequency coil in the form of a head coil 30, which may be a receive-only coil, a transmit-only coil, or a transmit/receive coil. More generally, one or more local radio frequency coils or coil arrays may be provided for imaging a region of interest such as an arm, leg, wrist, torso, or so forth. FIG. 4, as another example, shows a subject and a SENSE body coil disposed on the subject. The MR imaging optionally involves administration of a suitable magnetic contrast agent for enhanced magnetic resonance contrast. The nuclear imaging typically involves administration of a radiopharmaceutical to provide radioactivity for imaging by the nuclear imager 12.

The local head coil 30 is coupled with the remainder of the magnetic resonance receive system of the magnetic resonance imager 10 by a radio frequency cable, such as a coaxial cable. In FIGS. 1-3, an illustrative radio frequency cable 32 remains connected with the local head coil 30 throughout both the MR imaging and the nuclear imaging. The radio frequency cable 32 is configured to pass underneath the linearly translatable patient support pallet 22 and to have a first end remain coupled with the local head coil 30 (as shown) or with a device port connecting with the head coil 30, both when the patient support pallet 22 is moved into the examination region 24 of the MR imager 10 and also when the patient support pallet 22 is moved into the examination region 26 of the nuclear imager 12. A tensioner, spool 36 or other take-up mechanism is optionally disposed in or near the base 20 to take up the cable slack. In other contemplated embodiments, the cable is provided with a manual or automatic disconnect that disconnects the first end of the radio frequency cable from the head coil 30 when the patient support pallet 22 is moved into or toward the examination region 26 of the nuclear imager 12. A wireless connection between the local radio frequency coil and the MR imager is also contemplated. Moreover, one or more other magnetic resonance components besides or in addition to a local radio frequency coil may be disposed with the subject on the subject support 14. For example, an insert magnetic field gradient coil may be disposed with the subject on the subject support 14. Other contemplated magnetic resonance components include patient restraints, comfort pads or related accessories, electronics or cabling, visual or other stimulus devices for functional MR studies, and so forth.

The performing of magnetic resonance imaging using the MR imager 10 in cooperation with a local radio frequency coil or coil array and/or other magnetic resonance components disposed with the subject on the subject support 14 has advantages that are recognized in the magnetic resonance arts. For example, local coils can provide more intimate radio frequency coupling resulting in higher SNR, lower SAR (for a local transmit or local T/R coil), higher magnetic field gradient strength/rise time performance in the case of an insert magnetic field gradient coil, and other recognized advantages.

However, the magnetic resonance component is not useful during nuclear imaging data acquisition—indeed, the magnetic resonance component disposed with the subject absorbs radiation. On the other hand, removing the magnetic resonance component after MR imaging and before nuclear imaging (or, conversely, installing the magnetic resonance component after nuclear imaging and before MR imaging) is disadvantageous because the subject may be jostled, moved, or otherwise disturbed such that the position of the subject is substantially different for the MR and nuclear imaging data acquisitions. Large differences in position between the MR and nuclear imaging are disadvantageous because they make MR/nuclear image registration more difficult and less accurate, and in general makes it more difficult for the radiologist, physician, or other clinician or diagnostician to compare nominally corresponding MR and nuclear images regardless of whether spatial registration of the images is performed before such comparison. Installation or removal of the magnetic resonance component between imaging sessions is also disadvantageous because it lengthens the total imaging session time.

Accordingly, with reference to FIGS. 1 and 2, the head coil 30 is not removed between the nuclear and MR imaging. Acquired magnetic resonance imaging data benefits from the use of the head coil 30, and the resulting data is processed by a magnetic resonance (MR) image reconstruction processor 40 to generate an MR image. During the nuclear imaging, the head coil 30 can be expected to absorb some of the radiation used in the nuclear imaging. For example, if the nuclear imager 12 is a PET scanner, then it operates by detecting emissions of temporally coincident (within a temporal window) pairs of oppositely directed 511 keV gamma rays. Some of these gamma rays that would otherwise be detected are instead absorbed by material of the head coil 30. Acquired nuclear imaging data is therefore degraded by the presence of the head coil 30. To address this difficulty, a nuclear image reconstruction processor 42 incorporates a data corrector 44 that performs correction of the nuclear imaging data, or of the reconstructed image, based on a coil density map 46 that sets forth the radiation absorption characteristics of the head coil 30. A geometry processor 48 determines the presence or absence of the head coil 30. If the position of the head coil 30 is adjustable, then the geometry processor 48 also determines the position of the head coil 30. An image selector or registration processor 50 optionally spatially registers the MR and nuclear images, and selects one of the nuclear or MR images, or a slice or other portion of one of a 2D or 3D image, or a CINE sequence of temporally successive images, or a combination such as an overlay of the MR and nuclear images, or so forth, for display on an image display device 52 such as a video monitor, an LCD display, a plasma display, a printer or other marking engine producing a permanent image, or so forth.

The coil density map 46 can be generated in various ways. In an empirical approach, calibration nuclear imaging data are acquired of the head coil 30 or other magnetic resonance component, and the acquired calibration nuclear imaging data are reconstructed to generate the coil density map 46. For example, a cylindrical uniform flood source can be positioned along a central axis of the head coil and an attenuation map of the head coil is generated. Optionally, a phantom of the subject can be used in such calibration data acquisition, to simulate the effect of the subject and/or to provide structural support for the head coil 30 or other magnetic resonance component.

With reference to FIGS. 2 and 3, an example embodiment of the reconstruction components is shown, which is suitably used when the local coil (e.g., the head coil 30 of FIGS. 1 and 2) has a non-adjustable position on the patient support pallet 22. In this case, the geometry processor 48 includes a coil detector that determines whether the head coil 30 is mounted on the subject support pallet 22. With brief reference to FIG. 2, the coil detector can be embodied, for example, as contact sensors 56 that detect the insertion of the head coil 30 into a mating fixture 58. The contact sensors 56 may be, for example, spring-loaded pins that are compressed against the spring-loading to make an electrical contact when the head coil 30 is inserted into the mating fixture 58. If the geometry processor 48 does not detect the local head coil 30, then acquired nuclear data 60 is reconstructed by the nuclear image reconstruction processor 42 without invoking the data corrector 44 to produce a nuclear image 62.

On the other hand, if the geometry processor 48 does detect the local head coil 30, then acquired nuclear data 60 is reconstructed by the nuclear image reconstruction processor 42 as before, but additionally invoking the data corrector 44 to correct the nuclear image for radiation absorption by the head coil 30 to produce the nuclear image 62 as a corrected image. In order to make the correction, the data corrector 44 references the position of the head coil 30 to the frame of reference of the nuclear imaging data 60. In the approach illustrated in FIG. 3, this is done based on a position 64 of the subject support 22. The head coil 30 has a non-adjustable position on the subject support 22, while the movement of the subject support 22 into the nuclear imager 12 is typically calibrated with respect to the frame of reference of the nuclear imager 12. Accordingly, it is straightforward to determine the position of the head coil 30 respective to the frame of reference of the nuclear imaging data 60 based on the subject support position 64. For example, if the head coil 30 has a position $z_c^0$ when the subject support 22 is at its reference position $z_0$, then if the subject support 22 is advanced to a subject support position 64 of z then the corresponding coil position $z_c$ is $z_c = z_c^0 + (z - z_0)$.

Since in the embodiment of FIG. 3 the subject support 22 has only a single degree of motion freedom (e.g., axial or z directional movement), the data corrector 44 references the position of the head coil 30 to the frame of reference of the nuclear imaging data 60 by translating the coil density map 46 to the coil position $z_c$. The data corrector 44 can use various methods to perform the correction. In one approach, the acquired nuclear imaging data 60 are reconstructed to form an uncorrected image, the coil density map 46 stores a spatial radiation absorption map of the head coil 30, and the correction is performed by subtracting the densities of the coil density map 46 from the uncorrected reconstructed nuclear image to generate the corrected nuclear image 62. In another approach, the coil density map 46 stores information on the statistical likelihood of absorption of a radiation particle along each projection path, and this information is used to correct the acquired nuclear imaging data in projection space. The corrected projection data are then reconstructed to form the corrected nuclear image 62. Other techniques similar to those used to correct for bone, other radiation-absorptive tissue, implants, and the like are also contemplated.

With reference to FIG. 4, some local coils may be adjustably positioned. For example, FIG. 4 depicts a torso coil 30' that is an array of a plurality of planar single-loop coils suitably used as a SENSE array or other parallel imaging array. The depicted torso coil 30' has a back section (not visible in FIG. 4) with several planar single-loop coil elements disposed on the subject support 22 and a front section 70 with several additional planar single-loop coil elements that is placed over the front torso of the subject. Straps 72 compressively hold the torso coil 30' against the subject. The torso coil 30' is adjustably positioned in that the separation between the front and back sections varies depending upon the width or "thickness" of the subject, and in that the position of the torso coil 30' along the subject support 20 may vary from one patient loading to the next. It is noted that portions of both the anterior and posterior parts of the torso coil may wrap around the left-right periphery of the subject. In some cases the coil posterior part is not flexible and may be temporarily or permanently fixed in the patient support. In the case of an adjustably positionable local coil, the system of FIG. 3 is insufficient.

With reference to FIGS. 4 and 5, an example embodiment of the reconstruction components is shown, which is suitably used when the local coil (e.g., the torso coil 30 of FIG. 4) is adjustably positionable on the patient support pallet 22. In the illustrative embodiment of FIG. 5, the geometry processor 48 determines the position of the coil 30' based on input provided from the magnetic resonance imaging. Acquired magnetic resonance data 76 are reconstructed by the magnetic resonance processor 40 to generate a magnetic resonance image that images material within or on the local coil 30' or that images MR fiducial markers 80 disposed on or in the local coil 30'. Generally, the magnetic resonance imaging does not "see" the coil or coils array that is used for collecting the MR imaging data. Accordingly, the diagnostic or clinical MR image of the torso acquired by the MR imager 10 will not provide information from the local coil 30' suitable for determining the position of the local coil 30'. One way to overcome this difficulty is to include the fiducial markers 80 disposed on or in the local coil 30'. In this case, the diagnostic or clinical MR image will include contrast corresponding to the MR fiducial markers 80.

In some embodiments, the MR imaging acquires imaging data from the prevalent $^1$H nuclear species, and the MR fiducial markers 80 contain a different nuclear species other than or additional to the $^1$H species, the different nuclear species being detectable by the MR imager 10 to provide the desired MR visibility. For example, a multi-nuclear MR imaging sequence can be used to acquire a $^1$H image and an image of the second nuclear species so as to identify the MR fiducial markers 80 respective to the matrix set forth in the $^1$H MR image. In another approach, the MR fiducial markers 80 contain water or another material that is imaged in conventional MR imaging of the $^1$H nuclear species. In such embodiments, the MR fiducial markers 80 suitably have a shape, size, density, or other characteristic that is detectable in the MR images to identify the fiducial markers in the MR image. In some embodiments, it is contemplated to employ as few as a single MR fiducial marker; however, using two, three, or more MR fiducial markers 80 as shown in FIG. 4 advantageously enables more precise and detailed positional information to be derived. For example, a single fiducial marker is generally insufficient to determine canting, rotation, or other non-translational positional information for the local coil 30'. Alternatively, the fiducial markers can be imageable by the nuclear imager to enable the nuclear imager to determine the position of the local coil. Optionally, the fiducial markers can also serve other purposes, such as providing reference indicia for performing motion compensation, respiratory gating, or the like.

The geometry processor 48 determines the position of the local coil 30' on the subject support 22, including determining the spacing between the front and back sections of the torso coil 30', optionally determining canting, rotation, or other angulation of the front section 72 due to the shape of the subject's torso, or other positional information. The geometry processor 48 determines the position of the local coil 30' respective to the frame of reference of the MR imager 10. This is in turn readily referenced to the frame of reference of the subject support 22 on which the subject is disposed since the movement of the subject support 22 into the MR imager 10 is typically calibrated with respect to the frame of reference of the MR imager 10.

The positional information of the local coil 30' is used by the data corrector 44 to perform the correction as already set forth in conjunction with the embodiment of FIG. 3. The subject support position 64 calibrated with respect to the nuclear imager 12 during the nuclear imaging is used to reference the positional information of the local coil 30' respective to the subject support (determined from the MR data and/or the nuclear data) to the frame of reference of the acquired nuclear imaging data 60. The coil density map 46 is applied to perform the correction with suitable adjustment of the coil density map 46 to account for translation and, optionally, canting, rotation, or other angulation of the local coil 30' as determined from the MR imaging. In another embodiment the fiducials are imaged by both the MR and nuclear systems. The MR imager 10 can determine a higher resolution map of the local coil 30' and the nuclear imager 12 can be used to adjust that map for any movement between the MR and nuclear data acquisitions or during the nuclear data acquisition.

The fiducial markers 80 advantageously allow positional information pertaining to the local coil 30' to be determined from the diagnostic or clinical image. In this case it is preferred that the fiducial markers be limited in number and position such that they are always within the imaging field of view (FoV) of the MR image acquisitions normally performed with the particular coil/MR component, so as to not have aliasing of fiducial marker signal from out-of-FoV which may be misinterpreted in the MR image as a lesion or other tissue anomaly. In another approach, a separate coil imaging operation is performed using the MR imager 10 to determine the positional information pertaining to the local coil 30'. This alternative approach optionally does not rely upon the MR fiducial markers 80, and indeed the MR fiducial markers 80 may optionally be omitted in this alternative embodiment. This approach uses an MR imaging technique that images one or more of the materials of the local coil 30'. As noted previously, such materials are typically selected for their transparency to the MR imaging process. However, by using a specialized magnetic resonance imaging process, such as ultrashort time-to-echo (UTE) imaging, typical coil materials such as plastics and rubbers can be imaged using the MR imager 10. UTE imaging is described, for example, in Robson et al., "Magnetic Resonance: An Introduction to Ultrashort TE (UTE) Imaging", J Comput Assist Tomogr vol. 27, no. 6, pp. 825-46 (2003) which is incorporated herein by reference in its entirety.

UTE imaging is effective for sub-millisecond T2 materials such as certain rubbers and plastics. Thus, if the local coil 30' includes a plastic or rubber casing, as is typically used, then the UTE imaging can provide an image of the local coil 30' or a substantial portion or component thereof. Alternatively, if the coil materials are not UTE imageable with practically achievable ultra-short echo times, fiducial markers may be used that are imageable within the practically achievable range of UTE echo times. The geometry processor 48 processes the UTE image generated by the MR reconstruction processor 40 to determine the position of the local coil 30' respective to the frame of reference of the subject support 22, and the data corrector 44 corrects the nuclear image based on this positional information, the subject support position 64 in the nuclear imager 12, and based on the coil density map 46 as described previously.

In the embodiment of FIG. 5, the acquired MR data (for example, UTE imaging data, or diagnostic or clinical imaging data acquired in conjunction with MR fiducial markers 80, or separate MR data acquired in conjunction with the MR fiducial markers 80 that is not UTE imaging data and is not diagnostic or clinical imaging data) is used to determine the position of the MR coil respective to the subject support 22, which in turn is used to correct the nuclear image. However, it is to be appreciated that the nuclear imaging data can be acquired either before or after the MR data, or the MR and nuclear data acquisitions can be temporally interleaved. For integrated MR/nuclear scanners, it is contemplated to acquire MR and nuclear imaging data simultaneously.

With reference to FIG. 6, an alternative approach for correcting for the local coil 30' is described. In the approach of FIG. 6, the positional information for the local coil 30' is extracted from acquired nuclear imaging data 60. The nuclear image reconstruction processor 42 performs an initial reconstruction without invoking the data corrector 44. The result of this reconstruction is a nuclear image 84 without correction. The geometry processor 48 analyzes the uncorrected nuclear image 84 to extract positional information regarding the local coil 30'. In some embodiments, this analysis utilizes nuclear fiducial markers 90 which, for example, may suitably replace the MR fiducial markers 80 shown in FIG. 4. In some embodiments, the nuclear fiducial markers 90 contain a radioisotope emitting radiation detectable by the nuclear imager 12 so as to provide the desired visibility in the uncorrected nuclear image 84. By using markers that emit radiation of a different energy than the imaging radioisotope, the fiducial data are readily segmented from the imaging data. In some embodiments, it is contemplated to employ as few as a single nuclear fiducial marker; however, using two, three, or more nuclear fiducial markers 90 advantageously enables more precise and detailed positional information to be derived.

In other contemplated embodiments, the local coil 30' or a portion thereof has sufficient radiation absorption that it produces a discernable structure in the uncorrected nuclear image 84 from which the position of the local coil 30' can be determined.

With continuing reference to FIG. 6, the geometry processor 48 determines the position of the local coil 30' from the uncorrected nuclear image 84, either based on the imaged nuclear fiducial markers 90 or based on the direct image of the local coil 30' itself in the uncorrected nuclear image 84. Advantageously, in this embodiment the positional information from the local coil 30' is derived directly from acquired nuclear imaging data 60, and hence is intrinsically in the frame of reference of the acquired nuclear imaging data. Once the positional information is determined from the local coil 30', the processing flow loops back to the nuclear image reconstruction processor 42 which performs an updated image reconstruction that invokes the data corrector 44 in conjunction with the coil density map 46 and the positional information of the local coil 30' determined by the geometry processor 48, so as to generate the corrected nuclear image 62.

In the embodiment illustrated in FIG. 6, the same acquired nuclear imaging data 60 is initially reconstructed to form the uncorrected nuclear image 84, and is subsequently reconstructed again invoking the data corrector 44 to generate the corrected image 62. In other embodiments, two different nuclear imaging data acquisitions may be used. For example, a first nuclear imaging data acquisition may be performed to acquire nuclear imaging data from which the geometry processor derives the coil positional information, followed by a second nuclear imaging data acquisition that acquires the imaging data that is reconstructed in conjunction with the data corrector to generate the corrected nuclear image. In this latter approach using separate nuclear data acquisitions, the first nuclear data acquisition can be optimized to provide contrast indicative of the local coil 30'. For example, if nuclear fiducial markers 90 are used which are highly visible in the nuclear imaging, then a short-duration nuclear data acquisition may be sufficient to acquire enough information to determine the coil positional information. Such fiducials may also be used to monitor patient motion. On the other hand, if direct imaging of the local coil is relied upon, then the first nuclear imaging acquisition may be longer, or may use a lower resolution, fewer angular positions in the case of SPECT, or so forth to optimize the acquired data for speed and accuracy in determining the coil positional information.

With reference back to FIG. 1, the disclosed processing components, such as the illustrated reconstruction processors 40, 42 data corrector 44, geometry processor 48, and image selector or registration processor 50, can be physically implemented in various ways. In some embodiments, the components are implemented by a general purpose processor such as a microprocessor, microcontroller, or combination of microprocessors or microcontrollers in conjunction with a storage medium or media that stores instructions executable to perform selected methods implemented by the illustrated processing components 40, 42, 44, 48, 50. Such storage medium or media, or other storage medium or media, suitably store the coil density map 46 as well. The storage medium may be a non-volatile memory or storage such as an optical disk, magnetic disk, magnetic tape, FLASH memory, network server memory, or so forth, a volatile storage or memory such as random access memory (RAM), or various combinations thereof. In some embodiments, one, some, or all of the processing components 44, 50, 60, 70 are implemented as application specific integrated circuitry (ASIC) components. In some embodiments, one, some, or all of the processing components 40, 42, 44, 48, 50 are integrated with a computer that also provides the image display device 52. Such a computer optionally includes a hard drive or other storage medium storing instructions executable by one or more processors of the computer to perform selected methods implemented by the illustrated processing components 40, 42, 44, 48, 50. The various processing components 40, 42, 44, 48, 50 may be partially or wholly integrated in various ways, for example a single computer may embody some or all of the processing components 40, 42, 44, 48, 50, such computer optionally being logically disposed on a network or the Internet. These are merely some illustrative implementations, and the processing components 40, 42, 44, 48, 50 can be implemented as other configurations of hardware, software, firmware or various combinations thereof.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. An imaging method comprising:
acquiring magnetic resonance data of a subject using a magnetic resonance component disposed with the subject;
acquiring nuclear imaging data of the subject with the magnetic resonance component disposed with the subject;
determining a position of the magnetic resonance component respective to a frame of reference of the nuclear imaging data; and
reconstructing the nuclear imaging data to generate a nuclear image of at least a portion of the subject, the reconstructing including adjusting at least one of the nuclear imaging data and the nuclear image based on a density map of the magnetic resonance component and the determined position of the magnetic resonance component respective to the frame of reference of the nuclear imaging data to correct the nuclear image for radiation absorption by the magnetic resonance component.

2. The imaging method as set forth in claim 1, further comprising:
reconstructing the magnetic resonance data to generate a magnetic resonance image of at least a portion of the subject.

3. The imaging method as set forth in claim 1, wherein the magnetic resonance component is connected with a subject support that supports the subject and the magnetic resonance component during the acquiring of magnetic resonance data and during the acquiring of nuclear imaging data, and the determining comprises:
determining the position of the magnetic resonance component respective to the frame of reference of the nuclear imaging data based on a position of the subject support respective to the frame of reference of the nuclear imaging data and a predetermined position of the magnetic resonance component respective to the subject support.

4. The imaging method as set forth in claim 3, further comprising:
detecting the connection of the magnetic resonance component with the subject support, the adjusting of at least one of the nuclear imaging data and the nuclear image being performed conditional upon the detecting.

5. The imaging method as set forth in claim 1, wherein the determining comprises:
locating positions of one or more fiducial markers disposed on the magnetic resonance component from the acquired nuclear imaging data; and
deriving the position of the magnetic resonance component respective to the frame of reference of the nuclear imaging data from the positions of the one or more fiducial markers.

6. The imaging method as set forth in claim 5, wherein the locating comprises:
reconstructing the nuclear imaging data to generate an uncorrected nuclear image; and
identifying the positions of the one or more fiducial markers in the uncorrected nuclear image.

7. The imaging method as set forth in claim 1, wherein the determining comprises:
locating positions of one or more fiducial markers disposed on the magnetic resonance component from at least one of the acquired nuclear imaging data and the magnetic resonance data; and
deriving the position of the magnetic resonance component respective to the frame of reference of the nuclear imaging data from the located positions of the one or more fiducial markers.

8. The imaging method as set forth in claim 1, wherein the determining comprises:
acquiring ultrashort time-to-echo (UTE) magnetic resonance imaging data of the subject and the magnetic resonance component disposed with the subject;
reconstructing the UTE magnetic resonance imaging data to generate a UTE image including contrast corresponding to at least a portion of the magnetic resonance component; and
determining the position of the magnetic resonance component respective to the frame of reference of the nuclear imaging data based on the UTE image.

9. The imaging method as set forth in claim 1, further comprising:
acquiring calibration nuclear imaging data of the magnetic resonance component; and
reconstructing the calibration nuclear imaging data to generate the density map of the magnetic resonance component.

10. The imaging method as set forth in claim 1, wherein the acquiring of magnetic resonance data and the acquiring of nuclear imaging data are performed over a time interval during which the subject is not moved.

11. The imaging method as set forth in claim 1, further comprising one of:
moving the subject and the magnetic resonance component disposed with the subject from a magnetic resonance imager used to perform the acquiring of magnetic resonance data to a nuclear imager used to perform the acquiring of nuclear imaging data, and
moving the subject and the magnetic resonance component disposed with the subject from a nuclear imager used to perform the acquiring of nuclear imaging data to a magnetic resonance imager used to perform the acquiring of magnetic resonance data.

12. An imaging system comprising:
a magnetic resonance imager configured to acquire magnetic resonance data of a subject;
a nuclear imager configured to acquire nuclear imaging data from the subject;
a subject support configured to support the subject for acquisition of magnetic resonance data by the magnetic resonance imager and for acquisition of nuclear imaging data by the nuclear imager without repositioning the subject on the subject support;
a magnetic resonance component disposed with the subject on the subject support at a determinable position respective to a frame of reference of the nuclear imager, the magnetic resonance component cooperating with the magnetic resonance imager in the acquisition of magnetic resonance data; and
a nuclear image reconstruction processor configured to reconstruct the nuclear imaging data to generate a nuclear image of at least a portion of the subject, the nuclear image reconstruction processor including a data corrector that adjusts at least one of the nuclear imaging data and the nuclear image based on a density map of the magnetic resonance component to correct the nuclear image for radiation absorption by the magnetic resonance component.

13. The imaging system as set forth in claim 12, wherein the magnetic resonance component comprises at least one of (i) one or more radio frequency coils and (ii) an insert magnetic field gradient coil.

14. The imaging system as set forth in claim 12, further comprising:
an alignment element aligning the magnetic resonance component respective to the subject support, the position of the magnetic resonance component respective to the frame of reference of the nuclear imager being determinable from the position of the magnetic resonance component respective to the subject support.

15. The imaging system as set forth in claim 12, further comprising:
one or more fiducial markers disposed on the magnetic resonance component, the one or more fiducial markers being detectable by the nuclear imager to determine the position of the magnetic resonance component respective to the frame of reference of the nuclear imager.

16. The imaging system as set forth in claim 15, wherein the one or more fiducial markers contain a radioisotope emitting radiation detectable by the nuclear imager.

17. The imaging system as set forth in claim 12, further comprising:
one or more fiducial markers disposed on the magnetic resonance component, the one or more fiducial markers being detectable by the magnetic resonance imager to determine the position of the magnetic resonance component respective to the frame of reference of the subject support, the position of the magnetic resonance component respective to the frame of reference of the nuclear imager being determinable from the position of the magnetic resonance component respective to the subject support.

18. The imaging system as set forth in claim 17, wherein the fiducial markers are placed on or within the magnetic resonance component such that they are within a normally imaged field of view during the magnetic resonance imaging.

19. The imaging system as set forth in claim 17, wherein the magnetic resonance imager is configured to image $^1$H magnetic resonance, and the one or more fiducial markers contain a different nuclear species other than or additional to the $^1$H species, the different nuclear species being detectable by the magnetic resonance imager.

20. The imaging system as set forth in claim 12, wherein the magnetic resonance component includes a sub-millisecond $T_2$ material and the magnetic resonance imager is configured to perform ultrashort time-to-echo (UTE) imaging to image the sub-millisecond $T_2$ material of the magnetic resonance component so as to determine the position of the magnetic resonance component respective to the frame of reference of the subject support, the position of the magnetic resonance component respective to the frame of reference of the nuclear imager being determinable from the position of the magnetic resonance component respective to the subject support.

21. The imaging system as set forth in claim 20, wherein the sub-millisecond $T_2$ material of the magnetic resonance component includes at least one of a rubber material and a plastic material.

22. The imaging system as set forth in claim 12, wherein the magnetic resonance imager and the nuclear imager have a respective arrangement selected from the group consisting of:
   a spaced apart arrangement in which the subject support is selectively insertable into the magnetic resonance imager for magnetic resonance imaging of the subject and is selectively insertable into the nuclear imager for nuclear imaging of the subject, and
   an integrated arrangement in which the subject support has a common position in which the subject can be imaged by both the magnetic resonance imager and the nuclear imager.

23. One or more non-transitory digital storage media storing instructions executable by a microprocessor or microcontroller to perform a method including reconstructing nuclear imaging data to generate a nuclear image of at least part of a subject, the reconstructing including correcting at least one of the nuclear imaging data acquired from the subject and a nuclear image of at least part of the subject derived from said nuclear imaging data for radiation absorption by a magnetic resonance component disposed with the subject during acquisition of the nuclear imaging data.

24. The one or more non-transitory digital storage media as set forth in claim 23, wherein the one or more non-transitory digital storage media further store a density map of the magnetic resonance component that is used in the correcting.

\* \* \* \* \*